(12) United States Patent  
Morton et al.

(10) Patent No.: US 9,154,173 B1  
(45) Date of Patent: Oct. 6, 2015

(54) LINEAR SAMPLER

(71) Applicant: Raytheon Company, Waltham, MA (US)

(72) Inventors: Matthew A. Morton, Reading, MA (US); Jonathan P. Comeau, Winchester, MA (US); Anthony Kopa, Somerville, MA (US)

(73) Assignee: RAYTHEON COMPANY, Waltham, MA (US)

( * ) Notice: Subject to any disclaimer, the term of this patent is extended or adjusted under 35 U.S.C. 154(b) by 0 days.

(21) Appl. No.: 14/256,214

(22) Filed: Apr. 18, 2014

(51) Int. Cl.
  *H04B 1/26* (2006.01)
  *H03B 19/00* (2006.01)
  *H04B 1/28* (2006.01)

(52) U.S. Cl.
  CPC ........................................ *H04B 1/28* (2013.01)

(58) Field of Classification Search
  USPC .................................. 455/313, 323; 327/113
  See application file for complete search history.

(56) References Cited

U.S. PATENT DOCUMENTS

| | | | |
|---|---|---|---|
| 7,664,196 B2 | 2/2010 | Adlerstein | |
| 8,017,451 B2 | 9/2011 | Racz et al. | |
| 8,273,603 B2 | 9/2012 | Racz et al. | |
| 2004/0227581 A1 | 11/2004 | Noujeim | |
| 2008/0136456 A1* | 6/2008 | Chen et al. | 327/33 |
| 2011/0040818 A1 | 2/2011 | Fagg et al. | |

OTHER PUBLICATIONS

U.S. Appl. No. 14/256,216, filed Apr. 18, 2014, Morton et al.

2012 IEEE International Solid-State Circuits Conference, ISSCC 2012, Session 9, Wireless Transceiver Techniques, 9.7, pp. 174-176.
Caroline Andrews, Alyosha C. Molnar, A Passive Mixer-First Receiver With Digitally Controlled and Widely Tunable RF Interface, IEEE Journal of Solid-State Circuits, Voiume 45, No. 12, Dec. 2010, pp. 2696-2708.
T. Ashley, L. Buckle, S. Datta, M.T. Emery, D.G. Hayes, K.P. Hilton, R. Jeffries, T. Martin, T.J. Phillips, D.J. Wallis, P.J. Wilding, R. Chau, Heterogenous InSb quantum well transistors on silicon for ultra-high speed, low power logic applications, Electronic Letters, Jul. 5, 2007, vol. 43, No. 14, 2 pages.
Notification of Transmittal of the International Search Report and the Written Opinion of the International Searching Authority, or the Declaration, PCT/US2015/017240, May 18, 2015, 4 pages.
International Search Report, PCT/US2015/017240, May 18, 2015, 4 pages.
Written Opinion of the International Searching Authority, PCT/US2105/017240, May 18, 2015, 8 pages.

* cited by examiner

*Primary Examiner* — Nguyen Vo

(74) *Attorney, Agent, or Firm* — Daly, Crowley, Mofford & Durkee, LLP

(57) ABSTRACT

A frequency conversion circuit having a plurality of N signal channels, each being fed an input signal and a train of pluses having a period T and a duty cycle T/N. Each signal channel includes: a column III-V semiconductor sampler coupled the input signal and being responsive to sampling signals; and a column IV semiconductor controllable time delay for producing the train of sampling signals in response to a train of pulses produced on the column IV semiconductor, the time delay imparting a time delay to the pulses in accordance with a time delay command signal fed to the time delay. Each one of the sampling signals is produced by the time delay in each one of the channels with the period T and the duty cycle T/N with the sampling signals in one of the trains of the sampling signals being delayed with respect to the sampling signals in another one of the trains the sampling signals a time T/N.

2 Claims, 8 Drawing Sheets

LINEAR SAMPLER

TECHNICAL FIELD

This disclosure relates generally to linear samplers and more particularly to linear samplers used to convert radio frequency (RF) signals to baseband signals.

BACKGROUND AND SUMMARY

As is known in the art, RF samplers are commonly used prior to conversion to digital information in an analog to digital converter. Conventionally, the RF Sampler includes several switches that perform the frequency conversion and a baseband filtering network that conditions the output signals.

One frequency conversion application is in phased array antenna systems, such as that shown in FIG. 1. Here, a phased array system is shown having a plurality of antenna or radiating elements, each one of the elements being coupled to a corresponding one of a plurality of phase shifter sections. Each one of the phase shifter sections includes: an array port coupled to the corresponding one of the antenna elements. Each one of the phase shifter sections directs the signal received by the antenna element coupled to a pair of quadrature channels, each one of the channels having: a down converter section fed by the received RF signal and a local oscillator (LO) signal for converting the received radio frequency (RF) energy received by the antenna element to an intermediate frequency (IF) signal; and a phase shifter section fed by the down conversion section for providing a phase shift to the IF signal selectively in accordance with a phase shift command provided by a beam steering computer (BSC), as shown. The plurality of phase shifters produce, in response to the phase shift commands, a collimated and directed beam. It is understood that the directed beam may be used reciprocally in either a receive mode or, with a circulator or transmit/receive switch, not shown, a transmit mode. Thus, if the all the antenna elements are in-phase the antenna beam is directed along the boresight axis of the array. On the other hand if there is a fixed, non-zero, phase shift across the array, a directed beam is produced having an angle from the boresight axis in accordance with the fixed phase shift.

As is also known in the art, RF Samplers are commonly used to convert RF signals to analog baseband information prior to conversion to digital information in an analog to digital converter. Conventionally, the RF Sampler consists of several switches that perform the frequency conversion and a baseband filtering network that conditions the output signals. By using multiple switches that are active only during a fraction of the input signal cycle, the RF Sampler provides improved noise and loss performance over a conventional mixer.

More particularly, the RF Sampler is formed through the combination of three functions: frequency conversion via the sampling switches, Local Oscillator (LO) generation circuitry to drive the switches, and circuits that provide signal conditioning at the baseband output of the switches. FIG. 2A shows a simplified version of the RF Sampler architecture, where the input RF signal (VRF) is fed into 4 parallel switches (See a paper by Alyosha Molnar and Carline Andrews, "Impedance, Filtering and Noise in N-phase Passive CMOS Mixers," 2012 IEEE Custom Integrated Circuits Conference (CICC), pp. 1-8, 2012). At the output of the switches, load capacitors form the baseband signal processing circuits. In this case, the baseband circuits are low pass filters. For an RF Sampler architecture with 4 switches, each of the switches are closed with a 25% duty cycle, with the frequency of the switching operation set to the frequency of the RF signal to be down-converted. Each of the 4 switches is closed in quadrature, meaning that only one of the 4 switches is closed at a time, each for ¼ of the cycle time of the RF signal. An equivalent model with is shown in FIG. 2B and the LO driving the waveforms and resulting RF current and virtual voltage Vx is shown in FIG. 2C. One method for generating the necessary LO pulses is to use a bank of dividers driven by a signal at a multiple of the RF signal frequency (FIG. 2C). The four outputs of this RF Sampler then correspond to a differential representation of the in-phase and quadrature component of the down-converted RF signal.

This RF sampling approach differs from conventional mixer architectures in several ways. First, the switch used in the RF Sampler is designed to be as low impedance as possible, ideally providing a perfect short between the RF signal and the baseband filter. Unlike a mixer where the switching function is matched to 50 ohms on both the input and output, the baseband filtering of the RF sampler is effectively translated to RF. The result of this is a passband filter, providing rejection of interfering signals outside of the desired receive band. Through this process, the out-of-band linearity of the RF sampler circuitry is higher than with mixer approaches that often require separate RF filters to be present prior to the frequency converting circuitry. Another key difference is that the impedance to the switch control terminal (the gate, if the switch is a Field Effect Transistor (FET)) is ideally high, and not matched to 50 ohms. In this case, the LO generation circuitry (e.g. a network of dividers) drives the high-impedance switch terminals and ideally alternates each switch between an open and closed state.

RF Samplers are often employed in low-cost commercial applications where frequency conversion is required prior to conversion to the digital domain. The state of the art employs silicon technology, where the switches, the LO generation, and the baseband processing all take place within the same chip technology. Performing all functions on the same chip is the standard approach, as it provides the lowest cost means to achieve the functionality and enables the highest performance by keeping the parasitics between the functional blocks low.

The inventors have recognized that in order to achieve higher RF performance, it would be desirable to use Column III-V (for example GaN) FET switches while using silicon for the LO generation and baseband processing. A low parasitic interface required between the LO generation circuitry and the switches is achieved through either heterogeneous or nearly-heterogeneous packaging approaches, or by resonating out the bondwire parasitic with passive components on the III-V die. An example of a nearly-heterogeneous packaging approach is The Charles Stark Draper Laboratory, Inc., Cambridge, Mass. Integrated-Ultra High Density Packaging (iUHD) technology (U.S. Pat. Nos. 7,726,806 B2; 8,017,451 B2; 8,273,603 B2) or an Redistributed Chip Packaging (RCP) RCP technology of Freescale Semiconductor Inc., Corporate Headquarters 6501 William Cannon Drive West Austin, Tex. 78735 USA. Both packaging approaches enable close proximity of disparate MMIC technologies by encapsulating both die using silicon backend processing steps, where dielectric and metal layers are photo-lithographically defined to create interconnects that have similar characteristics to the interconnects found in the back end of commercial silicon processes—significantly lower inductance than bondwires. Heterogeneous integration of the III-V and silicon technology would provide similarly low-parasitic interconnects. If more commonplace packaging technologies are used, such as chip-and-wire, passive structures on the III-V die can be used to resonate out the inductance from the bondwires to achieve the desired low parasitic interconnect over a bandwidth of interest.

The inventors have recognized that the III-V switch be designed such that the closed position is close to zero impedance at the frequency of operation. Passive structures in the RF path can optionally be used to tune out the capacitive parasitics associated with the switch device. The baseband filtering section is designed to incorporate the parasitics of the interconnect between III-V and silicon die, such that the parasitics become part of the passband filter response at the input RF frequency. Because the III-V device has inherently higher voltage headroom than silicon technology, both the in-band and out-of-band linearity achieve a 10-15 dB improvement over the state of the art. The baseband and LO generation circuitry remains in silicon technology, where the relatively large number of devices and calibration procedures to tune the RF Sampler architecture are easily achievable.

The inventors have recognized that using III-V switches as part of an RF Sampler architecture provides a significant improvement in the linearity, making the approach more compatible with the higher performance requirements of military systems. The enhanced RF Sampler architecture provides benefits over traditional III-V-based mixer architectures, because the RF filtering function can be performed at baseband to achieve improved filtering response while minimizing insertion loss. Further, while the RF Sampler provides frequency conversion to baseband for a single RF signal, beamforming multiple RF signals as in a phased array antenna requires independent phase control of each RF signal and the summation of all signals into a combined output.

In accordance with one embodiment of the disclosure, a signal sampler is provided having: a column III-V semiconductor having formed therein a plurality of N, where N is an integer, transistor switches coupled to a common input of the sampler fed by the signal, each one of the plurality of N switches taking samples of the signal in response to a train of sampling signals fed to such one of the switches; and a column IV (such as silicon) semiconductor having analog signal processing circuitry and a generator for generating a plurality of N trains of the sampling signals, each one of the plurality of N trains of sampling signals being fed to a corresponding one of the N samplers. Each one of the N trains of sampling signals is generated with a period T and a duty cycle T/N with the sampling signals in one of the plurality of N trains of the sampling signals being delayed with respect to the sampling signals in another one of the plurality of N trains the sampling signals a time T/N.

In one embodiment of the disclosure, the analog signal processing circuitry a controllable time delay for producing the trains of sampling signals in response to a train of pulses, the time delay imparting a time delay to the pulses in accordance with a time delay command signal fed to the time delay and wherein each one of the sampling signals is produced by the time delay with the period T and the duty cycle T/N with the sampling signals in one of the trains of the sampling signals being delayed with respect to the sampling signals in another one of the trains of the sampling signals a time T/N.

In one embodiment of the disclosure, a frequency conversion circuit is provided having a plurality of N signal channels; each being fed an input signal and a train of pluses having a period T and a duty cycle T/N. Each signal channel includes: a sampler coupled the input signal and being responsive to sampling signals; and a controllable time delay for producing the train of sampling signals in response to the train of pulses, the time delay imparting a time delay to the pulses in accordance with a time delay command signal fed to the time delay. Each one of the sampling signals is produced by the time delay in each one of the channels with the period T and the duty cycle T/N with the sampling signals in one of the trains of the sampling signals being delayed with respect to the sampling signals in another one of the trains the sampling signals a time T/N.

With such an arrangement, the time delays between the trains of sampling signals may be independently controlled by the individual controllable time delays.

In one embodiment of the disclosure, a phased array antenna system is provided having: (A) a beam steering computer, (B) a plurality M, where M is an integers, of antenna elements each one being coupled to a corresponding one of a plurality of M antenna ports; (C) a pulse train source, the pulses in the train having a period T, and a duty cycle T/N; (D) a plurality of M frequency conversion/variable time delay circuits. Each one of the M frequency conversion/variable time delay circuits is coupled to a corresponding one of the M antenna ports. Each one of the M frequency conversion/variable time delay circuits comprises: a plurality of N, where N is an integer, signal channels, each one of the N signal channels being coupled to the corresponding one of the one of the M antenna ports. Each one of the signal channels includes: a sampler coupled to said corresponding one of the one of the M antenna ports and responsive to sampling signals fed thereto; a controllable time delay for producing the train of sampling signals to the sampler in such one of the signal channels in response to a train of pulses coupled to the controllable time delay in such one of the signal channels, the controllable time delay imparting a time delay δ to the pulses in the train of pulses coupled to the controllable time delay in such one of the signal channels in accordance with a time delay command signal fed to the controllable time delay by the beam seeing computer. Each one of the sampling signals in the N trains of sampling signals are produced by the controllable time delay in each one of the channels with a period T and a duty cycle T/N with the sampling signals in one of the N trains of the sampling signals being delayed with respect to the sampling signals in another one of the N trains a time T/N.

The details of one or more embodiments of the disclosure are set forth in the accompanying drawings and the description below. Other features, objects, and advantages of the disclosure will be apparent from the description and drawings, and from the claims.

DESCRIPTION OF DRAWINGS

Like reference symbols in the various drawings indicate like elements.

DETAILED DESCRIPTION

Figure 1:
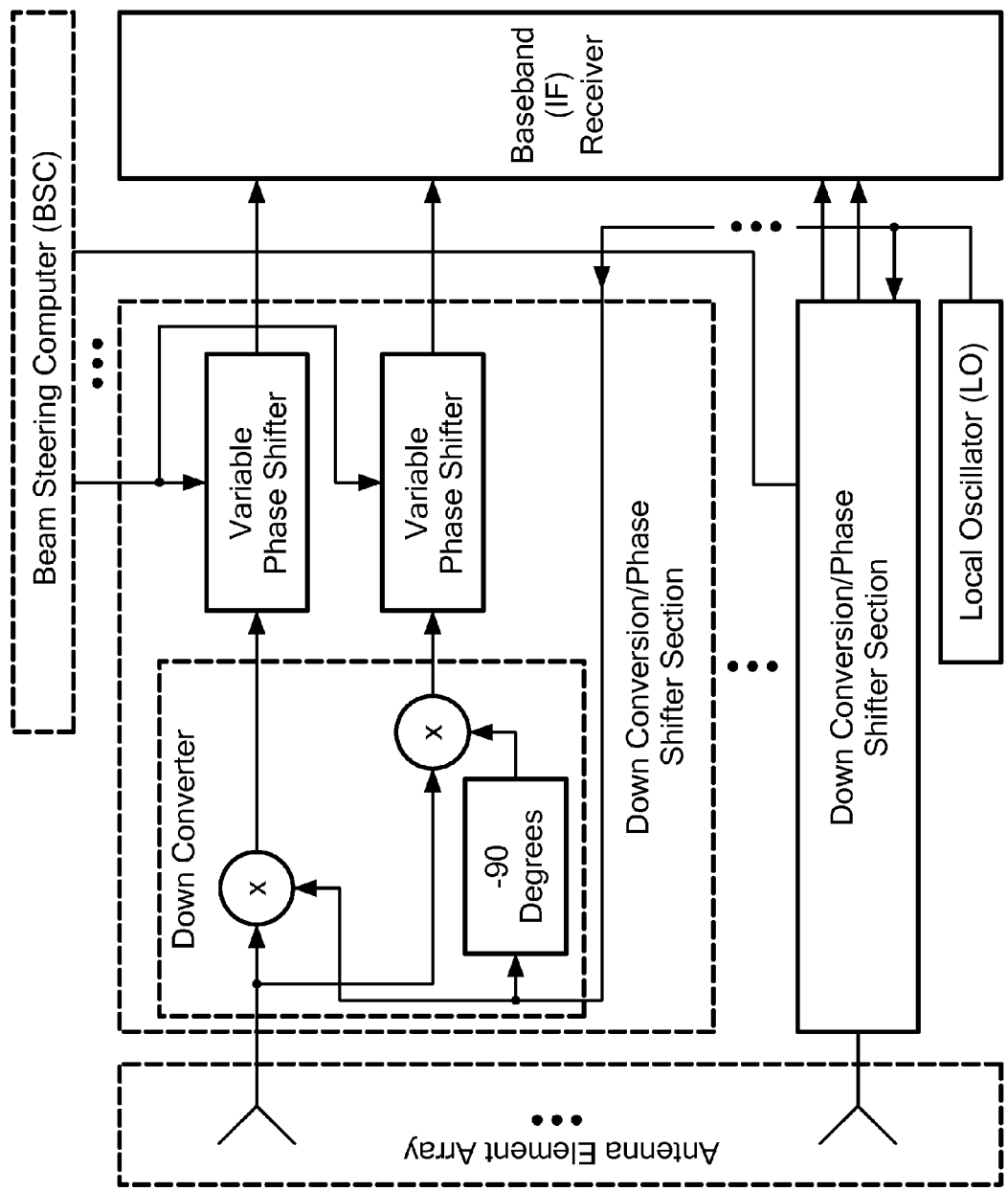
FIG. 1 is a block diagram of a Radio Frequency beam forming system for a phased array antenna system according to the PRIOR ART.
Figures 2A, 2B, 2C:
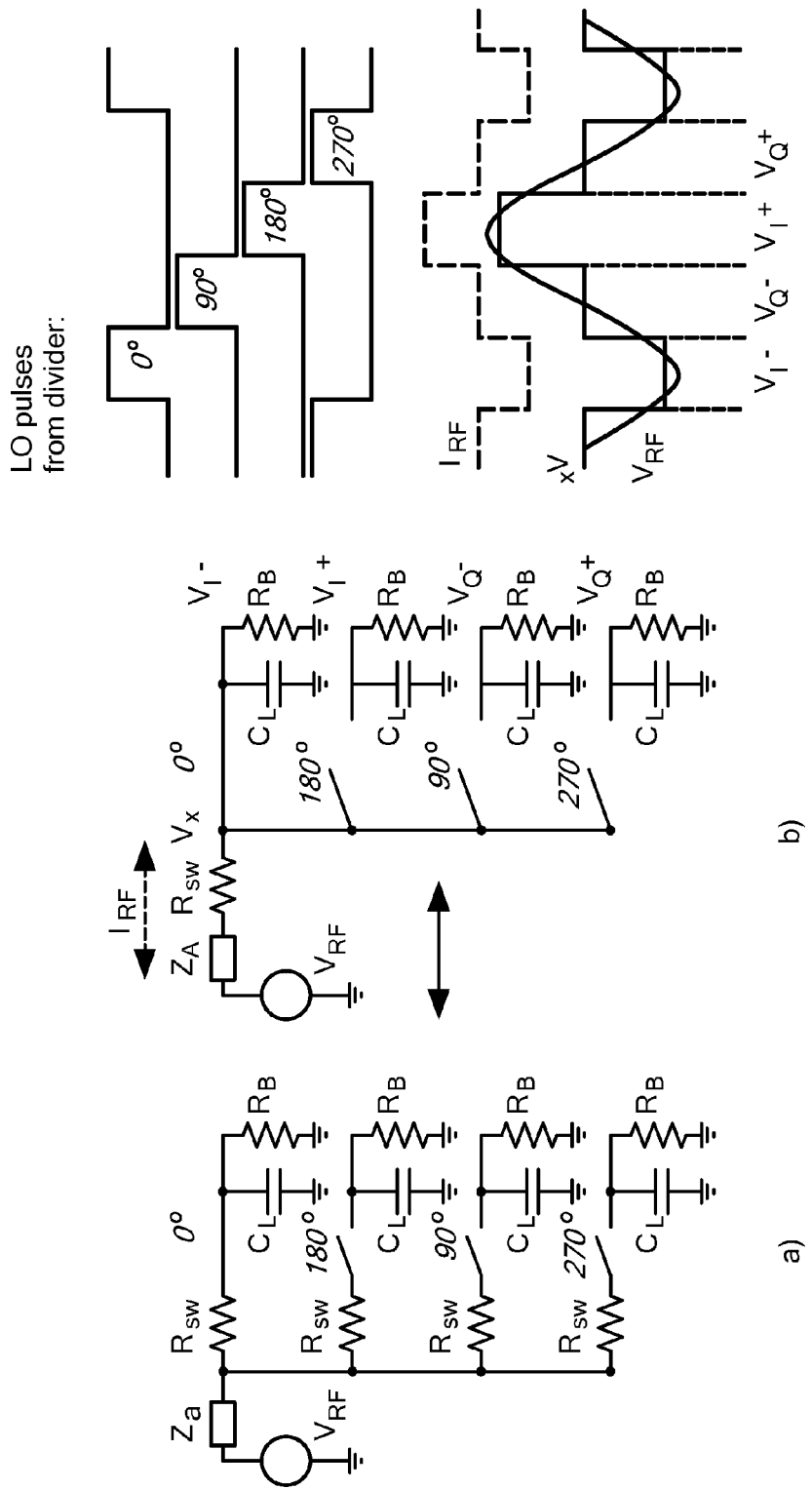
FIGS. 2A-2C are a schematic diagram and timing diagrams of a version of an RF Sampler architecture according to the PRIOR ART.
Figure 3:
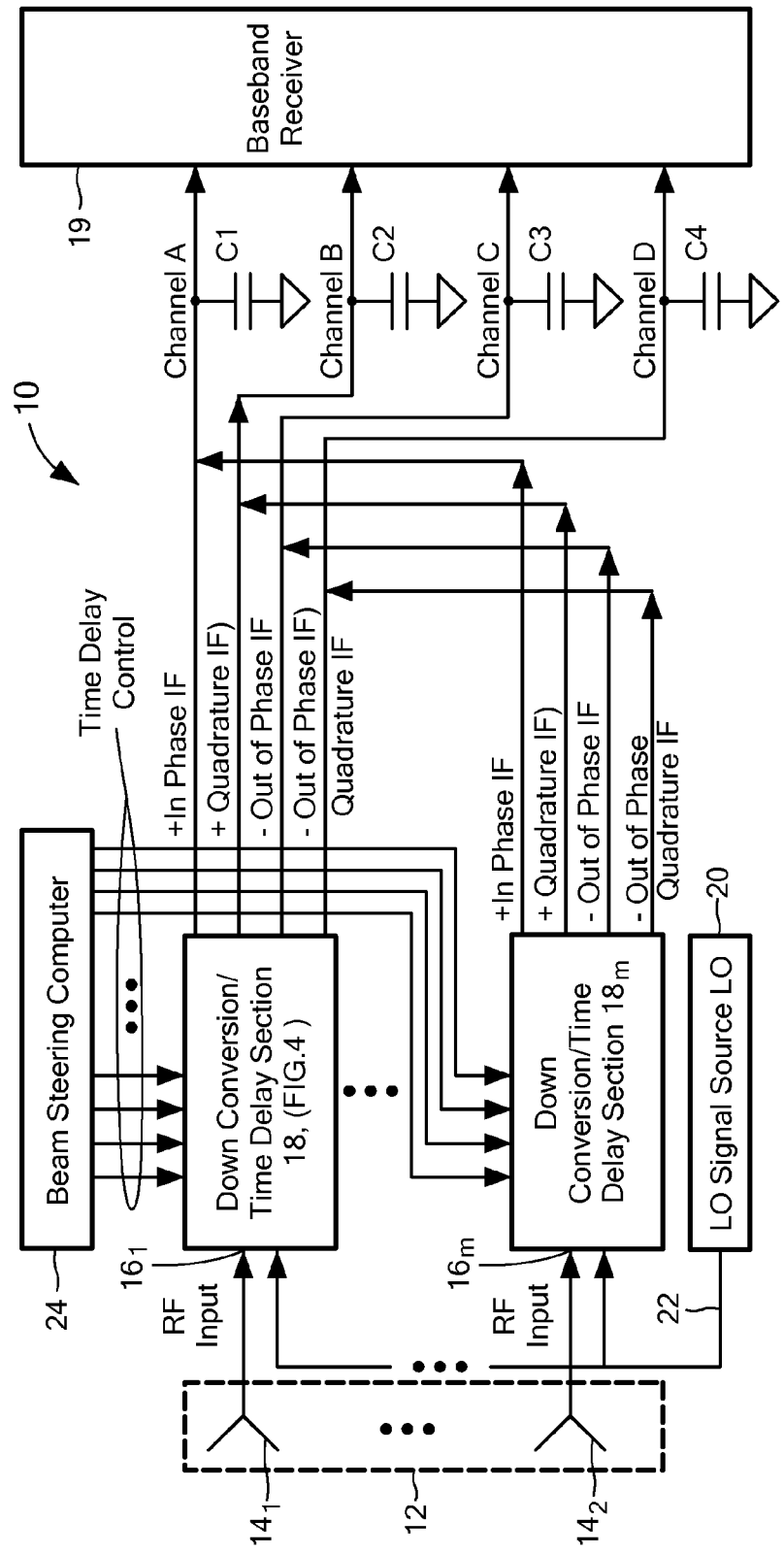
FIG. 3 is a block diagram of a phased array antenna system having a beam forming network and frequency conversion/time delay sections according to the disclosure.

Referring now to FIG. 3, a phased array antenna 10 is shown, having an array 12 of; M, where M is an integer, antenna elements $14_1$-$14_M$. Each one of the antenna elements $14_1$-$14_M$ is coupled to a corresponding one of a plurality of antenna ports $16_1$-$16_M$ of a corresponding M down conversion/time delay sections $18_1$-$18_M$, as shown. Each one of the M down conversion/time delay sections $18_1$-$18_M$, is identical in construction, an exemplary one thereof, here down conversion/time delay sections $18_1$ being shown in detail in FIG. 4. Each one of the down conversion/time delay sections $18_1$-$18_M$ is fed a common local oscillator (LO) signal from LO source 20 on line 22, here a train of pulses having a period T and a duty cycle 25 percent duty cycle. Each one of the down conversion/time delay shifter sections $18_1$-$18_M$: (1) converts the RF signal received at the antenna ports $14_1$-$14_M$, respectively, to a pair of differential baseband signals; one differential pair being a (+) in-phase signal and a (−) in-phase signal and the other differential pair being a (+) quadrature signal and (−) quadrature signal; and (2) provide a time delay to the signals passing through the down conversion/time delay sections $18_1$-$18_M$, respectively, selectively in accordance with a set of time delay signals fed to each one of the down conversion/time delay sections $18_1$-$18_M$ by a beam steering computer (BSC) 24, as shown. The (+) in-phase signal from the plurality of down conversion/time delay sections are fed, as shown in FIG. 3, to a first capacitor C1; the (−) in-phase signal from the plurality of down conversion/time delay sections are fed to a first capacitor C2; the (+) quadrature signal from the plurality of down conversion/time delay sections are fed to a first capacitor C3; the (−) quadrature signal from the plurality of down conversion/time delay sections are fed to a first capacitor C4; as shown. Thus, the four channels may be referred to as: a (+) in-phase signal channel (herein sometimes also referred to as CHANNEL A); a (+) quadrature signal channel (herein sometimes also referred to as CHANNEL B); a (−) in-phase signal channel (herein sometimes also referred to as CHANNEL C); and, a (−) quadrature signal channel (herein sometimes also referred to as CHANNEL A). The outputs of the capacitors C1-C4 are fed to a baseband receiver 19, as shown.

Figure 4:
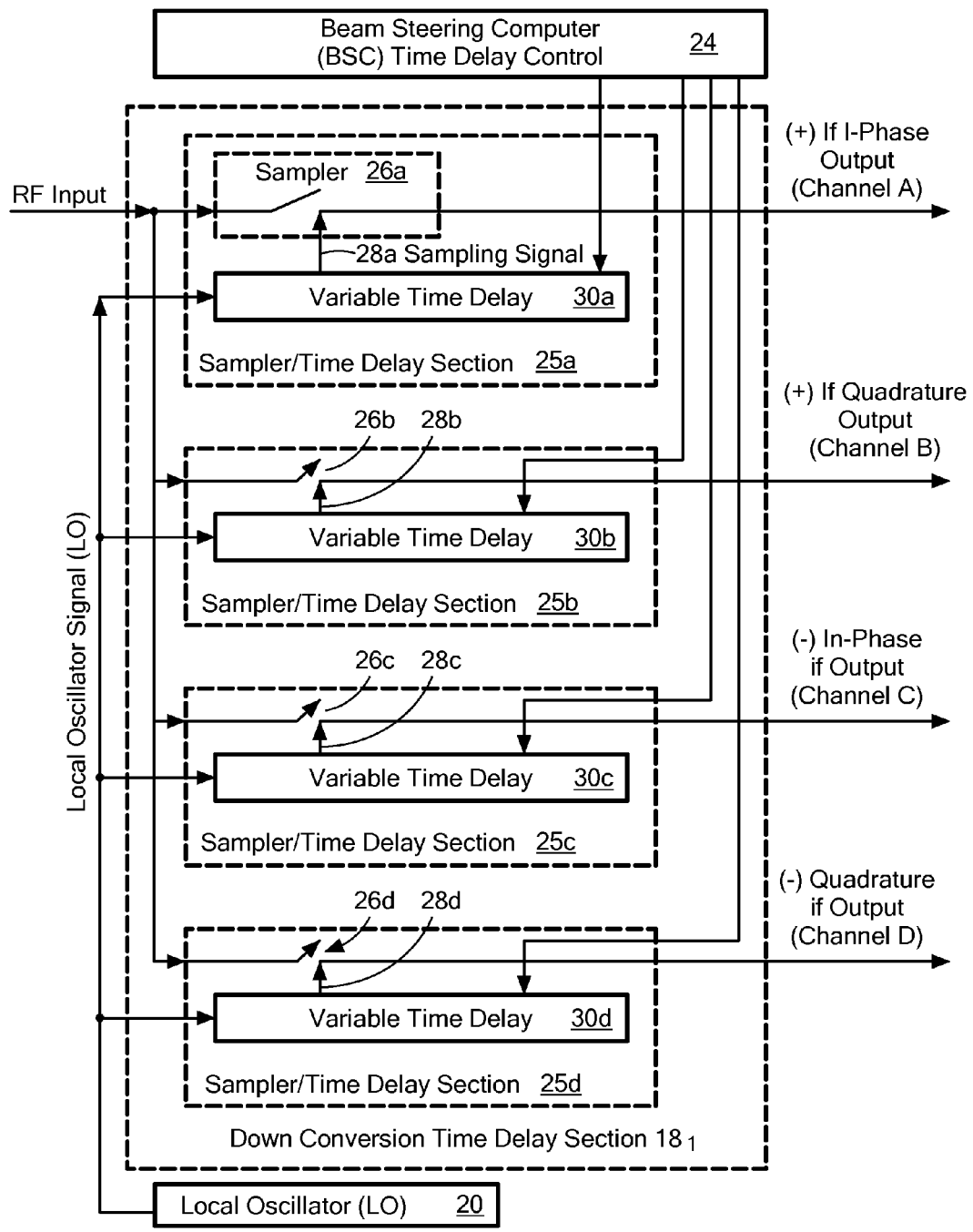
FIG. 4 is a block diagram of an exemplary one of the down conversion/time delay sections used in the phased array antenna system of FIG. 3 according to the disclosure.

Referring now in more detail to FIG. 4, an exemplary one of the M down conversion/time delay sections $18_1$-$18_M$, here down conversion/time delay sections $18_1$ is shown to include: a plurality of N, where N is an integer, here for example, 4, signal channels (CHANNELS A-D) all having inputs connected the antenna port $16_1$ of the down conversion/time delay section $18_1$, as shown. Each one of the signal channels, CHANNEL A-D, is identical in construction and includes sampler/time delay sections 25a-25d, respectively, each one of the sampler/time delay sections 25a-25d including: a sampler 26a-26d, respectively, here a field effect transistor (FET) having a gate electrode fed by a train of sampling signals on line 28 (shown in FIG. 5A); such train of sampling signals on lines 28a-28d being produced by a variable time delay 30a-30d, respectively, as shown. It is noted that all 4 time delays 30a-30d are fed the same LO train of pulses fed to the down conversion/time delay section $18_1$ on line 22. It is also noted that, referring to FIG. 3, the same LO train of pulses is fed to all M down conversion/time delay section $18_1$-$18_M$ through line 22. The time delay provided by the time delays 30a-30d is controlled by a time delay control signal fed to the time delays 30a-30d by the by the beam steering computer BSC 24, as shown. It is noted that each one of the 4 time delays 30a-30d is fed a corresponding one of the 4 time delay control signals by the BSC 24, as shown. It is also noted that a different set of 4 time delay control signals is fed to a different one of the M down conversion/time delay sections $18_1$-$18_M$, as shown in FIG. 3.

Figure 5:
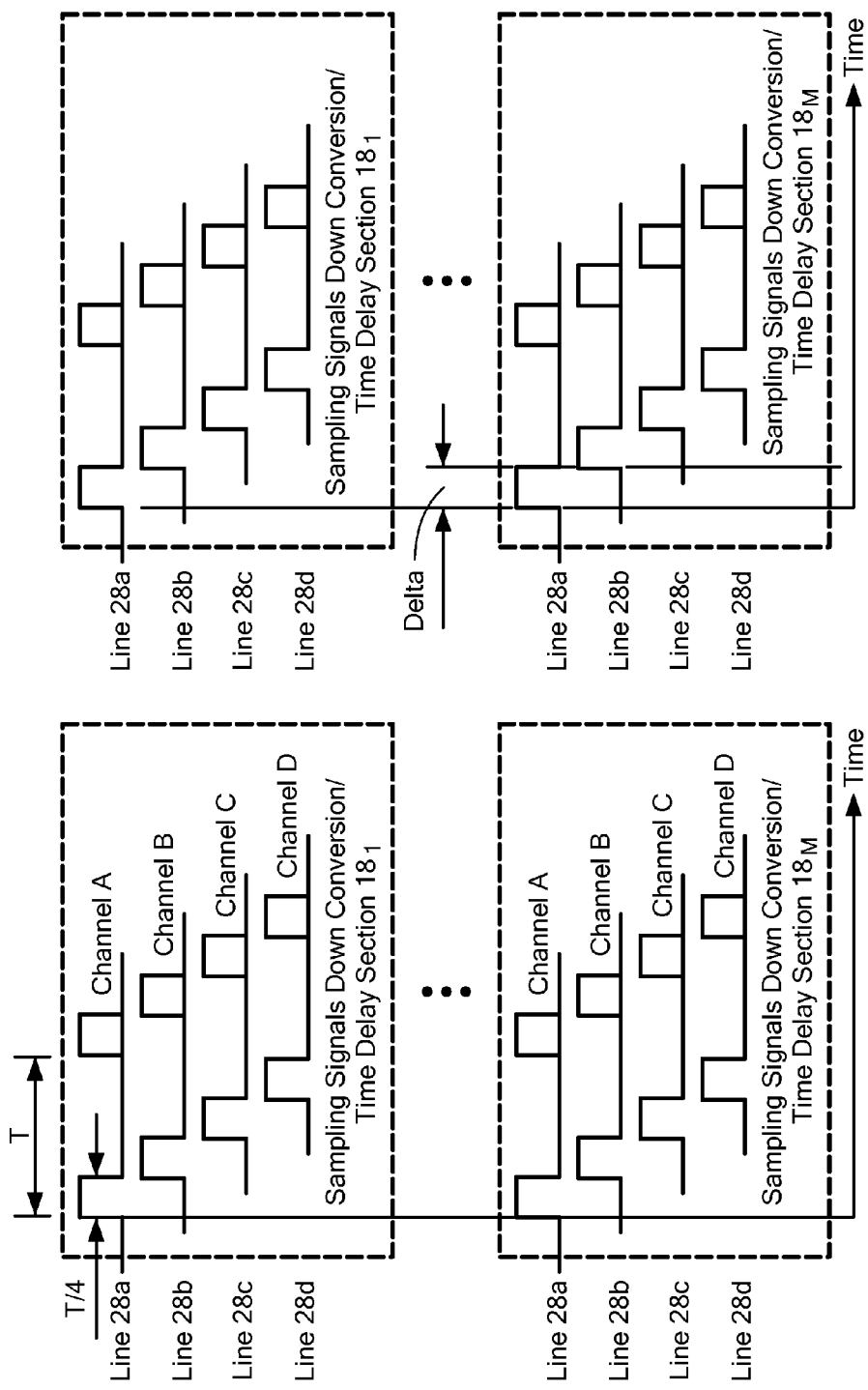
FIGS. 5A and 5B are timing diagrams used in the down conversion/time delay sections of FIGS. 3 and 4 according to the disclosure.

More particularly, as shown in FIG. 5A, the LO train of pulses on line 22 (FIG. 3) has a period T and a duty cycle, T/N, here T/4. It is noted that each one of the N trains of sampling signals produced by the time delays 30a-30d in each one of the four channels, respectively, has the period T and the duty cycle T/N. It is also noted that the sampling signals on line 28a in one of the N trains of the sampling signals is delayed with respect to the sampling signals in another one of the N trains the sampling signals a time T/N. More particularly, the train of sampling signals on line 28a fed to the sampler 26a in the (+) quadrature signal channel is delayed in time T/4 with respect to the train of sampling signals on line 28b fed to the sampler 26b in the (+) in-phase signal channel; the train of sampling signals on line 28b fed to the sampler 26b in the (−) in-phase signal channel is delayed in time T/4 with respect to the train of sampling signals on line 28c fed to the sampler 26c in the (+) quadrature signal channel; and the train of sampling signals on line 28c fed to the sampler 26c in the (−) quadrature signal channel is delayed in time T/4 with respect to the train of sampling signals on line 28d fed to the sampler 26d in the (−) quadrature signal channel.

It is noted that when the beam steering computer 24 directs a beam on boresight, the train of sampling pulses on line 28a in the (+) in-phase channels of all of the down conversion/time delay sections $18_1$-$18_M$ are in-phase; however, if the beam steering computer 24 wishes to direct a beam an angle Θ from boresight, the beam steering computer 24 produces time delay signals to the time delays 30a-30d in the M frequency conversion/time delay sections $18_1$-$18_M$ to delay the train of sampling pulses in the (+) in-phase channels an amount Δ, as shown in FIG. 5B, determined by a calibration procedure to be described. It is noted that the time delays in the produced in the other channels maintains the relationship described above: the train of sampling signals on line 28a fed to the sampler 26b in the (+) quadrature signal channel is delayed in time T/4 with respect to the train of sampling signals on line 28a fed to the sampler 26a in the (+) in-phase signal channel; the train of sampling signals on line 26c fed to the sampler 26c in the (−) in-phase signal channel is delayed in time T/4 with respect to the train of sampling signals fed to the sampler 26b in the (+) quadrature signal channel; and the train of sampling signals on line 28c fed to the sampler 26c in the (−) quadrature signal channel is delayed in time T/4 with respect to the train of sampling signals on line 28d fed to the sampler 26d in the (−) quadrature signal channel.

Figure 6:
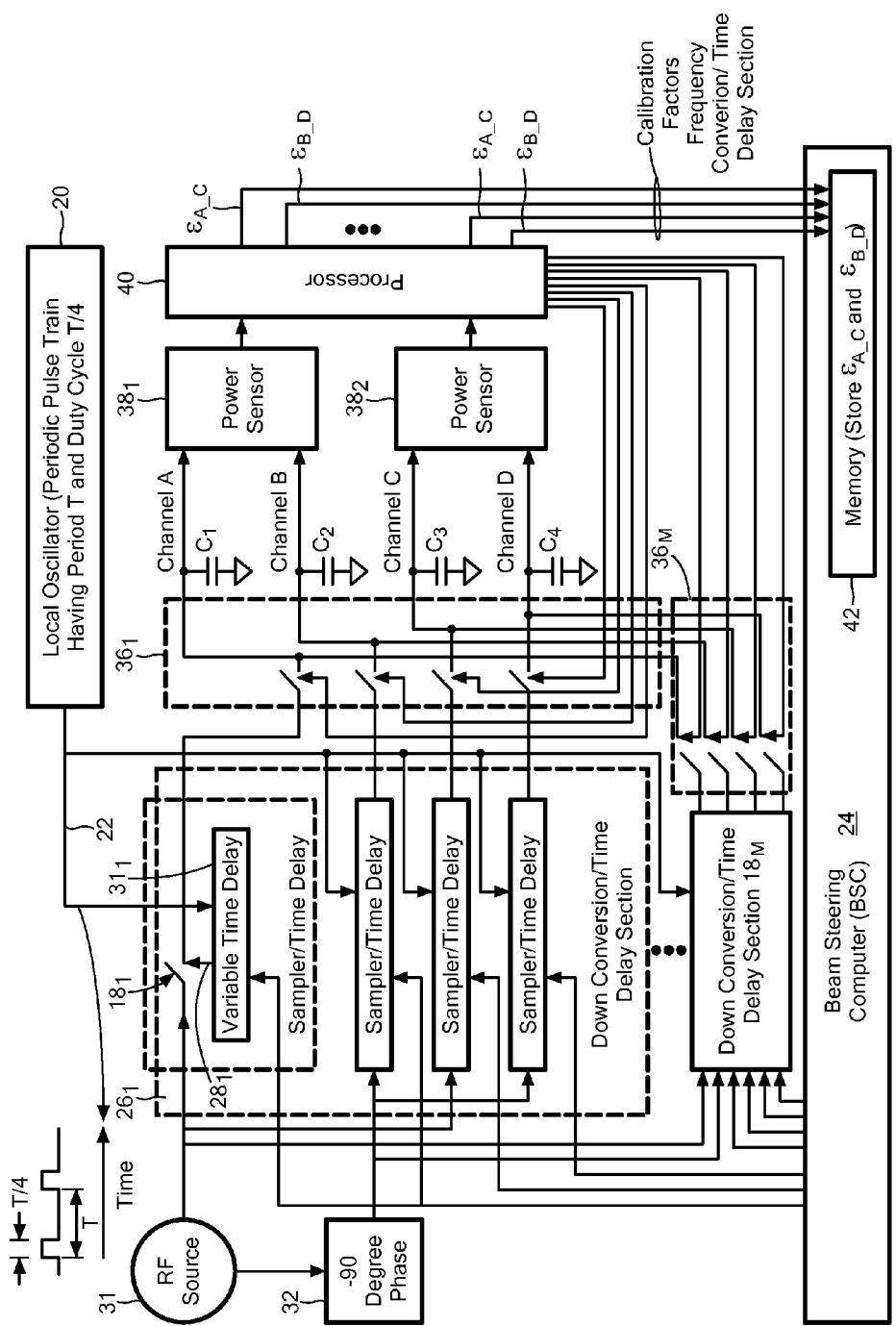
FIG. 6 is a block diagram of a testing arrangement for generating calibration factors used by a beam steering computer phased array antenna system of FIG. 3 in generating correction factors used by the beam steering computer in generating time delays for the down conversion/time delay sections according to the disclosure.

Referring now to FIG. 6, block diagram is shown of a testing arrangement for generating calibration factors used by the beam steering computer 24 in generating correction factors used by the beam steering computer in generating time delays for the time delays 30a-30d to in turn enable the time delays 30a-30d to produce the trains of sampling signal on lines 28a-28d described above in connection with FIGS. 5A and 5B.

The testing arrangement includes an RF source 31. The output of the RF source 31 is fed to the (+) in-phase and (−) in phase channels (CHANNELS A and C) of the M down conversion sections/time delay sections $18_1$-$18_M$ and to the RF source is fed, after passing through a ninety degree phase shifter 32, to the (+) quadrature channel and (−) quadrature channels (CHANNELS B and D) of the M down conversion sections/time delay sections $18_1$-$18_M$, as shown. The outputs of the (+) in-phase and (−) in phase channels (CHANNELS A and B) of the M down conversion sections/time delay sections $18_1$-$18_M$ are selectively coupled, through switch sections $36_1$-$36_M$, respectively, to capacitors $C_1$ and $C_2$, respectively, as shown. The capacitors $C_1$ and $C_2$ are coupled to a first power sensor $38_1$, as shown, and the (+) quadrature channel and (−) quadrature channels of the M down conversion sections/time delay sections $18_1$-$18_M$ are selectively coupled, through switch sections $36_1$-$36_M$, respectively, to capacitors $C_3$ and $C_4$, respectively, as shown. The capacitors $C_3$ and $C_{24}$ are coupled to a second power sensor $38_2$, as shown, The power sensors $38_1$, $38_2$ are coupled to a processor 40. The processor 40 operates the switch sections $36_1$-$36_M$ and determines calibration, or correction factors $\in_{A\_C}$ and $\in_{B\_D}$ for each one of the M down conversion/time delay sections $18_1$-$18_M$ sequentially in a manner to be described in connection with FIG. 7. Suffice it to say here that the determined correction factors $\in_{A\_C}$ and $\in_{B\_D}$ for each one of the M down conversion/time delay sections $18_1$-$18_M$ are sequentially stored in a memory 42 in the beam steering computer 24 and are used by the beam steering computer 24 in generating the time delay control signals for the variable time delay $30a$-$30d$ of samplers $26a$-$26d$ during normal beam forming operation of the system 10 shown in FIG. 3.

Figure 7:
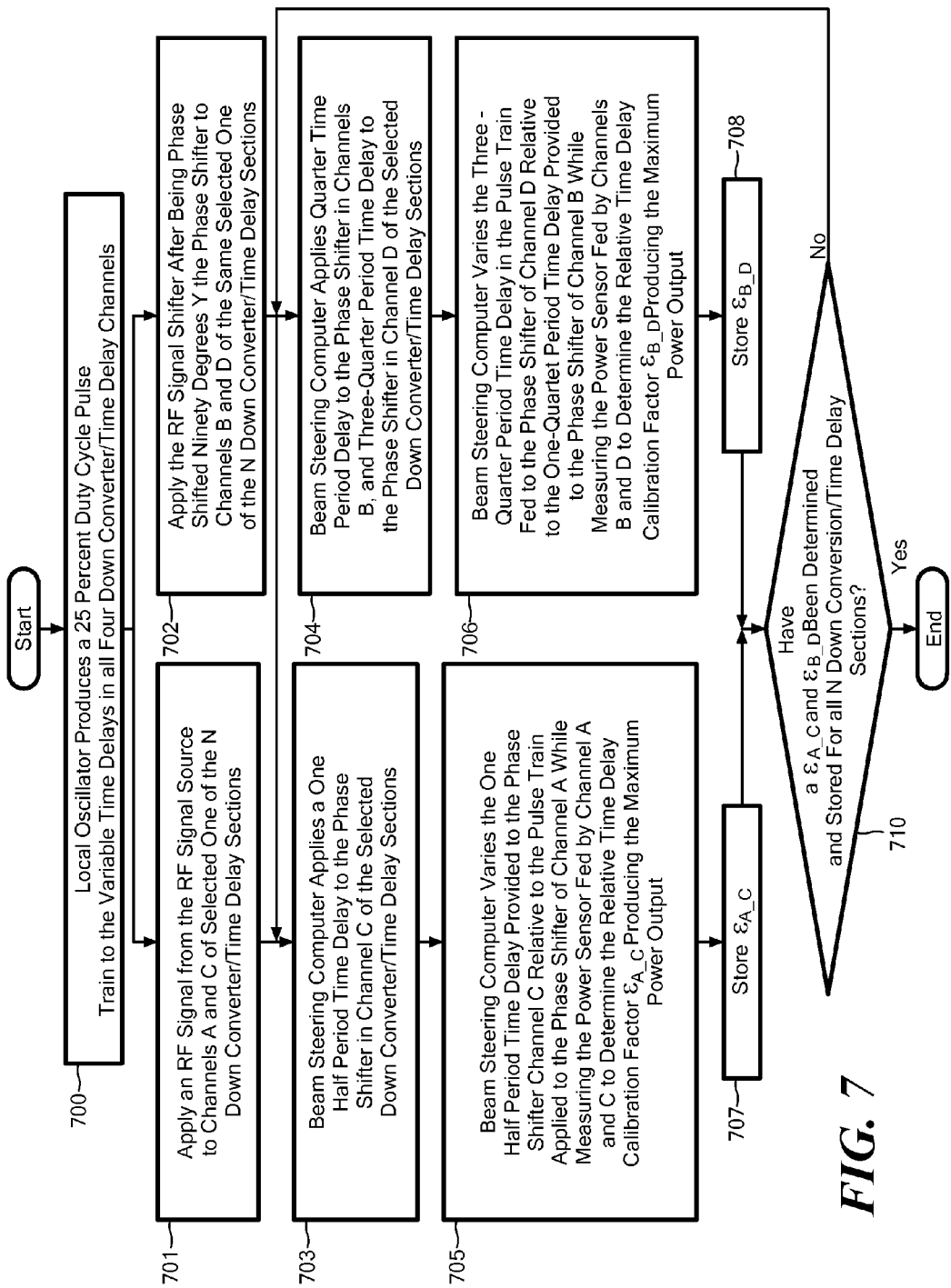
FIG. 7 is a flow chart of a process used by the testing arrangement of FIG. 6 in generating the correction factors according to the disclosure.

Referring now to FIG. 7, the local oscillator 20 produces a 25 percent duty cycle pulse train to the variable time delays $30a$-$30d$ in all four down converter/time delay channels (CHANNELS A-D) in one of the M frequency conversion/time delay sections $18_1$-$18_M$. (Step 700). The in-phase RF signal produced by the RF source 31 is fed to CHANNELS A AND C of selected one of the M down converter/time delay sections $18_1$-$18_M$ (Step 701) and at the same time, the RF signal shifted in phase 90 degrees by the phase shifter 32 is fed to CHANNELS B AND D of the same selected one of the M down converter/time delay sections $18_1$-$18_M$ (Step 702).

Two processes, PROCESS A and PROCESS B described below, here, in this example, now are performed to determine simultaneously the calibration, or correction factors $\in_{A\_C}$ and $\in_{B\_D}$ for each one of the M down conversion/time delay sections $18_1$-$18_M$:

Process A

The beam steering computer 24 applies a one half period time delay T/2 to the time delay $30c$ in CHANNEL C of the selected down converter/time delay sections $18_1$-$18_M$ (Step 703). The beam steering computer 24 varies the one half period time delay provided to the time delay $30c$ relative to the pulse train applied to the time delay $30a$ of CHANNEL A while measuring the power sensor $38_1$ fed by CHANNELS A AND C to determine the relative time delay $\in_{A\_C}$ producing the maximum power output (Step 705). The calibration factors $\in_{A\_C}$ are stored in the memory 42 of the beam steering computer 24 (Step 707).

Process B

The beam steering computer 24 applies quarter time period delay (T/4) to the time delay $308b$ in CHANNEL B, and three-quarter period time delay (3T/4) to the time delay $30d$ in CHANNEL D of the selected down converter/time delay sections $18_1$-$18_M$ (Step 704). The beam steering computer 24 varies the three-quarter period time delay in the pulse train fed to the time delay $30d$ relative to the one-quarter period time delay (T/4) provided to the time delay $30b$ of CHANNEL B while measuring the power in power sensor $38_2$ fed by CHANNELS B AND D to determine the relative time delay $\in_{B\_D}$ producing the maximum power output (Step 706). The calibration factors $\in_{B\_D}$ are stored in the memory 42 of the beam steering computer 24 (Step 708).

The processes A and B continue until the calibration factors $\in_{A\_C}$ and $\in_{B\_D}$ have been determined for all M frequency conversion/time delay sections $18_1$-$18_M$ (Step 710).

Next, the entire phased array system 10 is calibrated to determine the time delay commands for the time delays $30a$-$30d$ of the M frequency conversion/time delay sections $18_1$-$18_M$ to thereby produce proper beam angles for the phased array antenna system. For example, if R-bit, where R is an integer, time delays are used, $2^R$ beam angles may be produced in response to a corresponding one of $2^R$ sets of four time delays provided to time delays in the four channels (CHANNELS A, B, C and D) of each one of the M frequency conversion/time delay sections.

To calibrate each frequency conversion/time delay section for each of the $2^R$ sets of four time delays, the calibration process described earlier and summarized in FIG. 7 is performed with the RF source (31) set to phase increments corresponding with $360/2^R$ degrees. For example, the 0 degree case will set the phase of the RF source to be locked to the LO source (22) and the calibration procedure is performed to determine the calibration values and these values are then stored in memory. The RF source (31) is then advanced by $360/2^R$ degrees (if R=5, this would be 11.25 degrees) relative to the LO source (22). The calibration procedure is then performed for this phase setting. This process continues for all $2^R$ phase states, and then for all M frequency conversion/time delay sections. After calibration settings are stored in memory for all $2^R$ phase states for all M frequency conversion/time delay sections, the system is now calibrated for all desired beam positions where the particular beam position is determined by the relative time delay between all M frequency conversion/time delay sections in accordance with the standard relationship between the relative phase of each antenna element in a phased array and the resulting far-field beam pattern.

Figure 8:
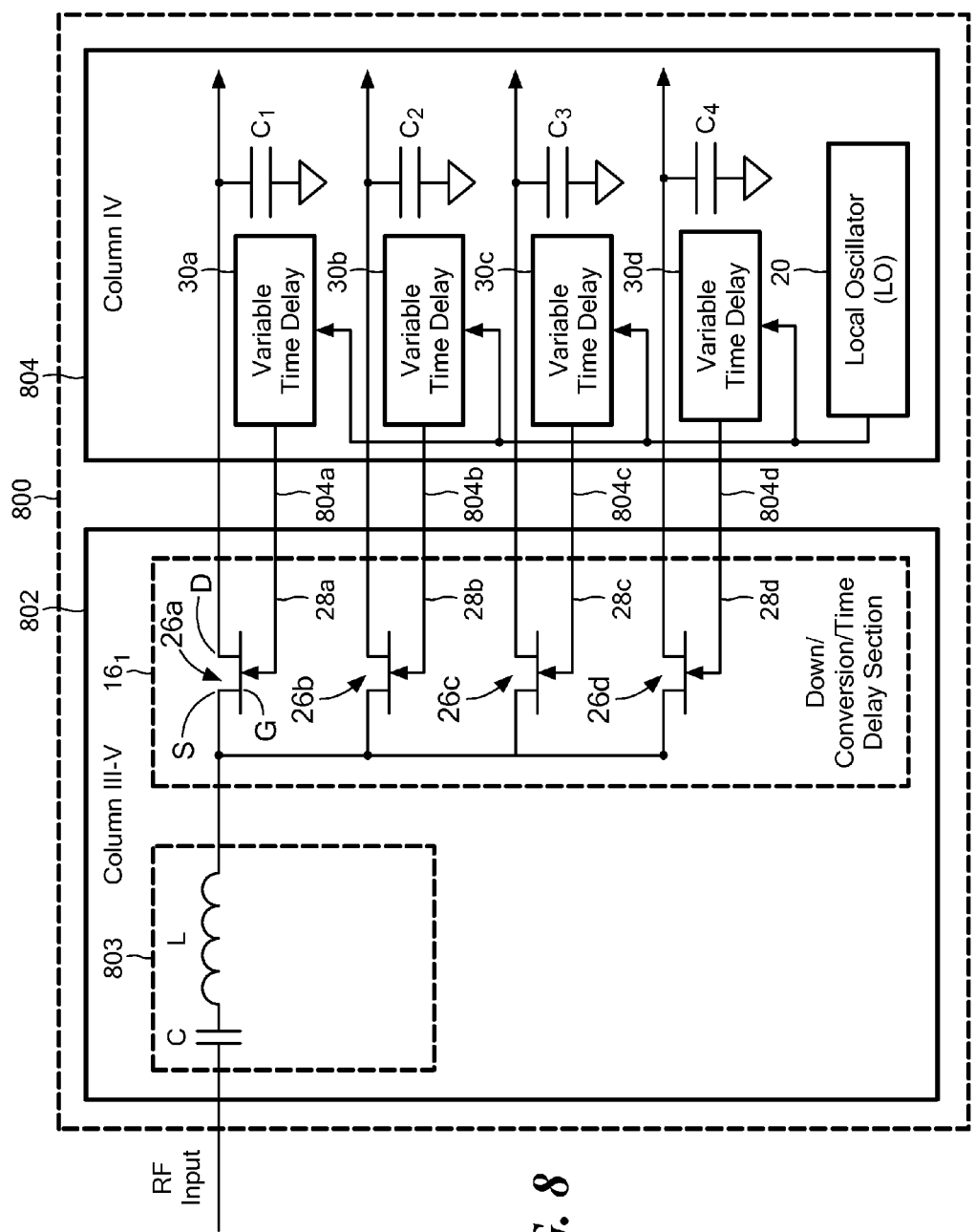
FIG. 8 is a semiconductor arrangement for an exemplary one of the frequency conversion/time delay sections of FIG. 4 according to the disclosure.

Next, referring to FIG. 8, a semiconductor arrangement 800 is shown for an exemplary one of the M frequency conversion/time delay sections, here section $18_1$. The section includes: a column III-V (for example Gallium Arsenide (GaAs or Gallium Nitride (GaN)) semiconductor 802 having formed therein four of the Field Effect Transistors (FETs) switches $26$-$26d$ (samplers) having the source electrodes (S) fed by the RF, as shown; the gates G fed by the sampling signals on lines $28a$-$28d$, respectively, as shown; and a column IV (or example silicon) semiconductor 804 having analog signal processing circuitry, including the four capacitors $C_1$-$C_4$, coupled to the drain electrodes (D) of the FET switches $26a$-$26d$, respectively, as shown, the four variable time delays $30a$-$30d$, and the LO generator 20 for generating trains of pulses for the four variable time delays $30a$-$30d$. A low parasitic interface between the LO generation circuitry and the switches may be achieved through either heterogeneous or nearly-heterogeneous III-V/IV packaging techniques described above (the iUHD technology or the Redistributed Chip Packaging (RCP)) technology or by resonating out the bondwire parasitic with passive components on the III-V die. More particularly, the III-V semiconductor 802 may have a circuit 803 of passive elements, such as inductor and capacitor C, as shown, arranged to tune out (remove) any parasitics associated with the switches 26a-26d in order to achieve a 50 ohm impedance match over the band of interest. It should be understood that other combination of parallel/series passive elements may be used if required.

The variable time delay circuits 30a-30d may include, for example, a conventional Digitally Controlled Delay Line or a conventional Voltage Controlled Delay Line (VCDL) along with a conventional digital-to-analog converter (DAC). The VCDL is a serial combination of inverters with a supply voltage on several of the inverters is connected to a control voltage instead of the nominal supply voltage. As this control voltage is reduced, the delay through the VCDL circuit is increased. A simple DC DAC is used to produce the control voltage based on digital commands supplied by the beam steering computer 24, as described above. The DVDL may include, for example, R inverters chained together, with the 1st and Rth inverter powered with the nominal supply voltage and the other internal inverters powered by the control voltage. The control voltage is supplied by a DAC (one DAC per VCDL, where each VCDL may contain some number of inverters).

The arrangement 800 may be formed on a common substrate having both III-V and IV, as described in U.S. Pat. No. 7,994,550, entitled "Semiconductor structures having both elemental and compound semiconductor devices on a common substrate", inventors, Kaper, et al., assigned to the same assignee as the present patent application, or on two different substrates; one of III-V and the other of IV.

A number of embodiments of the disclosure have been described. Nevertheless, it will be understood that various modifications may be made without departing from the spirit and scope of the disclosure. For example, a plurality of the M RF samplers may coexist on the same III-V and IV die, where portions of the IV baseband circuitry and LO generation circuitry can be shared. Accordingly, other embodiments are within the scope of the following claims.

What is claimed is:

1. A signal sampler, comprising:
   a column III-V semiconductor having formed therein a plurality of N, where N is an integer, transistor switches coupled to a common input of the sampler fed by the signal, each one of the plurality of N switches taking samples of the signal in response to a train of sampling signals fed to such one of the switches;
   a column IV semiconductor having analog signal processing circuitry and a generator for generating a plurality of N trains of the sampling signals, each one of the plurality of N trains of sampling signals being fed to a corresponding one of the N samplers;
   wherein each one of the N trains of sampling signals is generated with a period T and a duty cycle T/N with the sampling signals in one of the plurality of N trains of the sampling signals being delayed with respect to the sampling signals in another one of the plurality of N trains the sampling signals a time T/N.

2. The signal sampler recited in claim 1 wherein the analog signal processing circuitry includes a controllable time delay for producing the trains of sampling signals in response to a train of pulses, the time delay imparting a time delay to the pulses in accordance with a time delay command signal fed to the time delay and wherein each one of the sampling signals is produced by the time delay with the period T and the duty cycle T/N with the sampling signals in one of the trains of the sampling signals being delayed with respect to the sampling signals in another one of the trains the sampling signals a time T/N.

* * * * *